(12) United States Patent
Guezelarslan et al.

(10) Patent No.: US 11,936,405 B2
(45) Date of Patent: Mar. 19, 2024

(54) METHOD FOR COMPRESSING DIGITAL SIGNAL DATA AND SIGNAL COMPRESSOR MODULE

(71) Applicant: Rohde & Schwarz GmbH & Co. KG, Munich (DE)

(72) Inventors: Baris Guezelarslan, Munich (DE); Dominik Hettich, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 358 days.

(21) Appl. No.: 17/243,119

(22) Filed: Apr. 28, 2021

(65) Prior Publication Data

US 2021/0376852 A1     Dec. 2, 2021

(51) Int. Cl.
*H03M 7/30* (2006.01)
*G06N 3/04* (2023.01)
*H04L 27/34* (2006.01)

(52) U.S. Cl.
CPC ....... *H03M 7/6058* (2013.01); *G06F 2218/08* (2023.01); *G06N 3/04* (2013.01); *H03M 7/6041* (2013.01); *H03M 7/70* (2013.01); *H04L 27/3405* (2013.01)

(58) Field of Classification Search
CPC .... H03M 7/6058; H03M 7/6041; H03M 7/70; H04L 27/3405; G06N 3/04
See application file for complete search history.

(56) References Cited

U.S. PATENT DOCUMENTS

| | | | |
|---|---|---|---|
| 8,670,506 B2 | 3/2014 | Perthold et al. | |
| 10,060,961 B1 | 8/2018 | Fleizach et al. | |
| 10,382,245 B1 * | 8/2019 | Cirillo | H03M 7/30 |
| 2011/0060895 A1 * | 3/2011 | Solomon | G06F 8/36 |
| | | | 713/1 |
| 2019/0311259 A1 | 10/2019 | Cricri et al. | |
| 2020/0342893 A1 | 10/2020 | Choo et al. | |

FOREIGN PATENT DOCUMENTS

| | | | | |
|---|---|---|---|---|
| GB | 2584684 | * | 12/2020 | ........... A61B 5/0478 |
| WO | 2019083130 A1 | | 5/2019 | |

OTHER PUBLICATIONS

Huijben, I. A. M., et al., "Learning Sub-Sampling and Signal Recovery with Applications in Ultrasound Imaging," Cornell University Library, Ithaca, NY, Aug. 15, 2019, <arxiv.org>, 11 pages.

* cited by examiner

*Primary Examiner* — Joseph J Lauture
(74) *Attorney, Agent, or Firm* — Christensen O'Connor Johnson Kindness PLLC

(57) ABSTRACT

A method of compressing digital signal data obtained from a signal is described. The method includes: receiving digital signal data associated with a signal and/or generating digital signal data based on a signal; transforming the digital signal data into a transform domain, thereby generating transformed digital signal data; determining at least one characteristic parameter based on the transformed digital signal data by an artificial intelligence circuit; detecting and/or classifying at least one wanted signal portion based on the at least one characteristic parameter by the artificial intelligence circuit; and storing only a subset of the digital signal data that is associated with the at least one wanted signal portion. Further, a signal compressor circuit for compressing digital signal data obtained from a signal and a computer program are described.

19 Claims, 5 Drawing Sheets

METHOD FOR COMPRESSING DIGITAL SIGNAL DATA AND SIGNAL COMPRESSOR MODULE

FIELD OF THE DISCLOSURE

Embodiments of the present disclosure generally relate to a method of compressing digital signal data obtained from a signal. Embodiments of the present disclosure further relate to a signal compressor circuit for compressing IQ data obtained from a signal and to a computer program.

BACKGROUND

Baseband in-phase and quadrature data (IQ data) are the basis for radio frequency (RF) signal generation as well as radio frequency signal analysis. Given the trend in radio frequency applications towards higher bandwidths in general and in certain applications such as surveillance and/or data analysis towards longer record lengths, larger amounts of IQ data have to be stored. Accordingly, larger data storages as well as higher bandwidth capacities are required. Therefore, methods for compressing the IQ measurement data are of great interest wherein the respective methods also have to ensure a small deviation from the original signal when reconstructing the respective signal from the compressed IQ measurement data.

Typically, the IQ data, or in general digital signal data associated with an electromagnetic signal, are compressed based on the so-called µ-law compression. However, this approach effectively reduces the data fidelity of the digital data as a trade-off with reducing the number of bits required to store the respective data. Typically, compression ratios of 2:1 or 3:1 with acceptable loss of fidelity are achieved wherein an increase of 1% of the error vector magnitude (EVM) occurs.

In fact, the compression techniques used are based on retaining data in the most significant bits. However, the compression ratios achieved are not satisfying with respect to the increase in IQ data to be processed due to higher bandwidths and/or longer record lengths.

Thus, there is a need for a method and a signal compressor circuit that are capable of compressing digital signal data in a more effective way.

SUMMARY

Embodiments of the present disclosure provide a method of compressing digital signal data obtained from a signal. In an embodiment, the method comprises the following steps:

receiving digital signal data associated with a signal and/or generating digital signal data based on a signal;

transforming the digital signal data into a transform domain, thereby generating transformed digital signal data;

determining at least one characteristic parameter based on the transformed digital signal data by an artificial intelligence circuit or module;

detecting and/or classifying at least one wanted signal portion based on the at least one characteristic parameter by the artificial intelligence module; and storing only a subset of the digital signal data that is associated with the at least one wanted signal portion.

Therein and in the following, the term "detect the wanted signal portion" is understood to mean that portions of the transformed digital signal data corresponding to the at least one wanted signal portion are identified.

Moreover, the term "classify the wanted signal portion" is generally understood to mean that (certain) information about the signal is determined that is associated with a certain class of electromagnetic signals. For example, a modulation type of the wanted signal portion and/or a symbol rate of the wanted signal portion are determined.

Of course, the signal may comprise several wanted signal portions. Accordingly, several (i.e., two or more) wanted signal portions may be detected and/or classified with the method according to the present disclosure.

The method according to the present disclosure is based on the idea to isolate wanted signal portions in the signal, i.e., signal portions carrying actual information, by the artificial intelligence module.

Only the subset associated with the wanted signal portions is stored, while the digital signal data corresponding to the remaining signal portions may be discarded. For example, digital signal data corresponding to signal disturbances, for example noise, may be discarded. In another aspect, the digital signal data relating to unwanted signals that are not of interest, but may have significant signal power, may also be discarded.

This way, the amount of memory needed can be reduced, as the digital signal data is compressed to the relevant subset of digital signal data. However, no information is lost during the compression of the digital signal data, as only the digital signal data corresponding to irrelevant portions of the signal or corresponding to unwanted signals are discarded, for instance noise, or for example a WIFI signal when the wanted signal is an LTE downlink.

The transform domain may depend on the type of signal processed. Thus, the transform domain used for digital signal (measurement) data compression may be selected from a set of different transform domains depending on the type of signal.

The respective transform domain may be at least one of a time domain, a frequency domain or a time-frequency domain (also called spectrogram or rather spectrogram waterfall) so that the respective digital signal data is transformed in a suitable transform domain depending on the type of signal processed as mentioned above. Thus, the respective signal, or more precisely the digital signal data associated with the signal, may be transformed into the frequency domain, for instance by applying a Fourier transform, or into a time-frequency domain for compressing the respective digital signal measurement data appropriately.

The at least one wanted signal portion may be identified automatically based on preset parameters. Generally, the preset parameters are associated with certain properties of the at least one wanted signal portion. For example, the preset parameters are associated with a modulation type of the at least one wanted signal portions, with a frequency content of the at least one wanted signal portions, with amplitudes of the at least one wanted signal portions, with a signal-to-noise-ratio of the at least one wanted signal portions etc.

Thus, the artificial intelligence circuit or module may be employed to detect and/or classify the at least one wanted signal portion based on the preset parameters.

In some embodiments, a user may set the preset parameters in order to narrow down the wanted signal to specific types of signals. Accordingly, other types of signals that are not associated with the preset parameters may be discarded.

According to an aspect of the present disclosure, the at last one characteristic parameter is associated with a modulation type of the signal. Thus, the artificial intelligence module in an embodiment automatically detects and/or classifies the modulation of the at least one wanted portion of the signal. No previous knowledge about the modulation type of the signal is necessary, as the artificial intelligence module automatically recognizes the modulation type of at least the wanted portions of the signal.

According to another aspect of the present disclosure, the subset of the digital signal data is stored together with meta-information on the signal. Generally speaking, the meta-information corresponds to additional information on the at least one wanted portion of the signal that may be necessary in order to reconstruct the at least one wanted portion of the signal even with the remaining digital signal data being discarded. However, the meta-information may be stored in more efficient way, such that the overall needed memory is reduced.

In a further embodiment of the present disclosure, the meta-information comprises a noise level associated with at least one discarded subset of the digital signal data and/or a time stamp. Thus, a time order of the wanted signal portions may be reconstructed based on the time-stamps provided. Moreover, the background noise contained in the signal may be reconstructed based on the stored noise level.

The at least one characteristic parameter may comprise at least one correlation parameter, for example a correlation multi-dimensional algebraic object comprising several correlation parameters. It was found that the at least one correlation parameter comprises information that enables separating signals even if they have the same frequency. In other words, colliding signals, also called interfering signals, can be separated and/or identified with the methods according to the present disclosure.

According to another aspect of the present disclosure, the correlation multi-dimensional algebraic object is at least of third order. In some embodiments, the correlation multi-dimensional algebraic objects of third order is a tensor of third order. In some embodiments, two of the three indices of the multi-dimensional algebraic object of third order are associated with frequencies, while the third index is associated with time.

According to a further embodiment of the present disclosure, entries of the correlation multi-dimensional algebraic object are determined that correspond to frequency-to-frequency correlation coefficients. In some embodiments, entries of the correlation multi-dimensional algebraic object are determined that correspond to frequency-to-frequency correlation coefficients that are associated with a predetermined time span.

An observed frequency range of the electromagnetic signal may be divided into several frequency portions in order to determine the correlation multi-dimensional algebraic object and/or an observed time interval may be divided into several time intervals in order to determine the correlation multi-dimensional algebraic object. Accordingly, the entries of the correlation multi-dimensional algebraic object are associated with certain frequency portions and/or with certain time intervals.

According to another aspect of the present disclosure, the correlation multi-dimensional algebraic object is unfolded, thereby obtaining at least one unfolded correlation multi-dimensional algebraic object, for example wherein the at least one unfolded correlation multi-dimensional algebraic object is used as an input for the artificial intelligence module. Thus, additional information on the wanted signal is provided in form of the unfolded correlation multi-dimensional algebraic object.

When a multi-dimensional algebraic object of n-th order is unfolded with respect to one index, generally speaking, the result is a multi-dimensional algebraic object of (n−1)-th order.

When a multi-dimensional algebraic object of n-th order is unfolded with respect to two indices, generally speaking, the result is a multi-dimensional algebraic object of (n−2)-th order and so on.

Higher order singular values of the correlation multi-dimensional algebraic object may be determined based on the at least one unfolded correlation multi-dimensional algebraic object, wherein the higher order singular values of the correlation multi-dimensional algebraic object are used as an input for the artificial intelligence module. Thus, additional information on the wanted signal is provided in some embodiments in form of the higher order singular values.

It is noted that the at least one correlation parameter may be determined by a "classical" statistical sub-circuit or sub-module of the artificial intelligence module. More precisely, the statistical sub-module may determine the at least one correlation parameter via suitable statistical techniques. The at least one correlation parameter may then be used as an input of a machine-learning based sub-module of the artificial intelligence module.

Based on the at least one correlation parameter, signal portions having different frequencies can be detected that, however, belong together. This is for example the case if a signal is split up into several different frequencies, i.e., in the case of so-called multi-tone signals.

It has turned out that several different classes of wanted signal portions are associated with similar correlation parameters. Accordingly, the number of different correlation parameters that the artificial intelligence module has to be trained for is reduced. Thus, artificial intelligence learning structures can be used, which generally results in an enhanced processing speed for the detection and/or classification.

Moreover, even signal classes that the artificial intelligence module has not been trained for can be detected, if the corresponding signal class is associated with similar correlation parameters as another signal class that the artificial intelligence module has been trained for.

Therein and in the following, the term "correlation multi-dimensional algebraic object of n-th order" is understood to be an algebraic object having n indices, wherein the entries each are a correlation parameter comprising correlation information on the signal.

The correlation parameter may be a frequency-to-frequency correlation coefficient, for example a Pearson correlation coefficient. It has turned out that frequency-to-frequency correlation coefficients are particularly insensitive to signal noise and are particularly suitable for separating colliding signals. Hence, a more robust or rather resistant method is ensured.

According to another aspect of the present disclosure, a spectrogram of the digital signal data is determined based on the transformed digital signal data. The spectrogram corresponds to a spectrum of the digital signal data over time, i.e., the spectrogram comprises the transformed digital signal data at several particular times or time slices.

In a further embodiment of the present disclosure, the at least one characteristic parameter is determined based on the spectrogram, for example based on characteristic patterns in the spectrogram. In other words, an image representation of the, for example an image representation of the spectrogram (e.g., a heat map or a waterfall diagram), is processed via the artificial intelligence module in order to detect and/or classify the at least one wanted signal portion.

According to an aspect of the present disclosure, the at least one characteristic parameter is determined via an image analysis technique that is applied to an image associated with the transformed digital signal data, for example to the spectrogram of the digital signal data. Therein, the image may be generated based on the transformed digital signal data, and the image may be used as an input for the artificial intelligence module.

According to another aspect of the present disclosure, the artificial intelligence module comprises a machine learning circuit or module, wherein the machine learning module is trained to determine the at least one characteristic parameter, and/or wherein the machine learning module is trained to detect and/or classify the at least one wanted signal portion.

In some embodiments, it has turned out that the at least one correlation parameter described above can be analyzed via machine learning techniques and the wanted signal can be detected and/or classified easily compared to the approaches known from the state of the art.

Moreover, machine learning techniques are particularly suitable for automated image analysis techniques, and thus for the analysis of the spectrogram via image analysis techniques described above.

Therein, any suitable machine learning technique known from the state of the art may be used in order to train the machine learning module.

In some embodiments, the machine learning module comprises an artificial neural network, for example a convolutional neural network (CNN). In some embodiments, the artificial neural network is a deep convolutional neural network (DCNN). Such CNNs or DCNNs are particularly suitable for image processing and/or image recognition techniques.

According to a further aspect of the present disclosure, the wanted signal portion and/or the signal is reconstructed based on the stored digital signal data, for example based on the stored meta-information. As all relevant information on the signal (contained in the subset of the digital signal data) are stored, the wanted signal portions and/or the complete signal can be reconstructed based on the stored digital signal data.

In some embodiments, if the meta-information comprises information on the noise level of the original signal, even the noise-content of the original signal may be reproduced based on the stored digital signal data and the stored meta-information.

In some embodiments, the digital signal data is established as IQ data. In other words, the digital signal data comprises both in-phase data (I data) and quadrature data (Q data). Thus, the method described above can be used to compress IQ data associated with an electromagnetic signal.

Embodiments of the present disclosure further provide a signal compressor circuit or module for compressing digital signal data obtained from a signal. The signal compressor module comprises a receiver circuit or module, a transformation circuit or module, an artificial intelligence circuit or module, and a memory circuit. The receiver module is configured to receive digital signal data associated with a signal and/or to generate digital signal data based on a signal. The transformation module is configured to transform the digital signal data into a transform domain, thereby generating transformed digital signal data. The artificial intelligence module is configured to determine at least one characteristic parameter based on the transformed digital signal data. The artificial intelligence module is further configured to detect and/or classify at least one wanted signal portion based on the at least one characteristic parameter. The memory circuit is configured to store only a subset of the digital signal data that is associated with the at least one wanted signal portion.

In some embodiments, the signal compressor module is configured to perform any one of or all of the methods for compressing digital signal data obtained from a signal described above.

Regarding the advantages and further properties of the signal compressor module, reference is made to the explanations given above with respect to the method for compressing digital signal data obtained from a signal, which also hold for the signal compressor module and vice versa.

According to an aspect of the present disclosure, the artificial intelligence module comprises a machine learning circuit or module, wherein the machine learning module is trained to determine the at least one characteristic parameter, and/or wherein the machine learning module is trained to detect and/or classify the at least one wanted signal portion.

In some embodiments, it has turned out that the at least one correlation parameter described above can be analyzed via machine learning techniques and the wanted signal can be detected and/or classified relatively easily compared to the approaches known from the state of the art.

Moreover, machine learning techniques are particularly suitable for automated image analysis techniques, and thus for the analysis of the spectrogram via image analysis techniques described above.

Therein, any suitable machine learning technique known from the state of the art may be used in order to train the machine learning module.

According to another aspect of the present disclosure, the machine learning module comprises an artificial neural network, for example a convolutional neural network (CNN). In some embodiments, the artificial neural network is a deep convolutional neural network (DCNN). Such CNNs or DCNNs are particularly suitable for image processing and/or image recognition techniques.

Embodiments of the present disclosure further provide a computer program comprising program code means, executable program instructions, scripts, etc., being adapted to cause a signal compressor module, for example the signal compressor module described above, to perform the method described above when the computer program is executed on a central processing unit (or other processor circuit), for example on a central processing unit of the signal compressor module described above.

Therein and in the following, the term "program code means" is understood to comprise machine-readable instructions in compiled and/or uncompiled form being provided in any suitable programming language and/or machine language.

Regarding the advantages and further properties of the computer program or the computer readable medium having the computer program stored thereon, reference is made to the explanations given above with respect to the methods for compressing digital signal data obtained from a signal, which also hold for the computer program and vice versa.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed. Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

In the following description, numerous specific details are set forth in order to provide a thorough understanding of exemplary embodiments of the present disclosure. It will be apparent to one skilled in the art, however, that many embodiments of the present disclosure may be practiced without some or all of the specific details. In some instances, well-known structures or process steps have not been described in detail in order not to unnecessarily obscure various aspects of the present disclosure. Further, it will be appreciated that embodiments of the present disclosure may employ any combination of features described herein.

Figure 1:
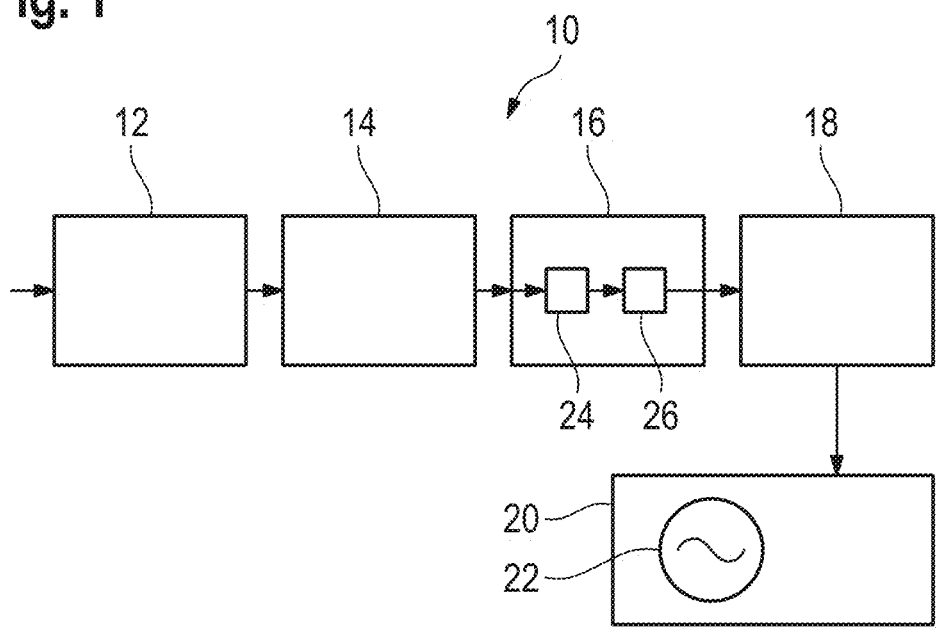
FIG. 1 schematically shows a block diagram of a signal compressor circuit or module according to an embodiment of the present disclosure.

FIG. 1 schematically shows a signal compressor module 10 comprising a receiver module 12, a transformation module 14, an artificial intelligence module 16, and a memory 18. The signal compressor module 10 may further comprise a signal generator module 20 having a signal generator circuit or unit 22. In some embodiments, the signal generator unit 22 is established as a numerically controlled oscillator (NCO) or as any other suitable type of signal generator.

In some embodiments, the term "module" as used herein refers to or includes, inter alia, a combination of hardware (e.g., a processor such as an integrated circuit or other circuitry) and software (e.g., machine- or processor-executable instructions, commands, or code such as firmware, programming, or object code). Furthermore, a combination of hardware and software may include hardware only (i.e., a hardware element with no software elements), software hosted at hardware (e.g., software that is stored at a memory and executed or interpreted at a processor), or hardware with the software hosted thereon. In some embodiments, the hardware may, inter alia, comprise a CPU, a GPU, an FPGA, an ASIC, or other types of electronic circuitry.

Generally speaking, the signal compressor module 10 is configured to receive and/or generate digital signal data associated with an electromagnetic signal, and to compress the digital signal data associated with the received signal. In some embodiments, the digital signal data is established as IQ data. Without restriction of generality, the representative embodiment of the digital signal data being IQ data will be described in the following. However, it is to be understood that the digital signal data may also be established as any other type of digital data that is associated with the electromagnetic signal.

The functionality of the individual modules (e.g., circuits) will be described in more detail below. The artificial intelligence circuit or module 16 comprises an analysis circuit or module 24 and a machine learning circuit or module 26. In some embodiments, the machine learning module 26 comprises an artificial neural network. For example, the artificial neural network may comprise a convolutional neural network (CNN) and/or a deep convolutional neural network (DCNN).

Figure 2:
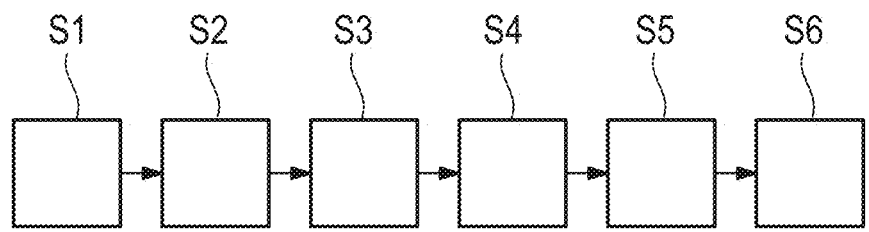
FIG. 2 shows a flow chart of a method of compressing digital signal data obtained from a signal according to an embodiment of the present disclosure.

The signal compressor module 10 is configured to perform a method for compressing IQ data obtained from a signal. The method is described in the following with reference to FIG. 2.

IQ data that is associated with an electromagnetic signal is received by the receiver module 12 (step S1). Alternatively or additionally, the electromagnetic signal is received by the receiver module 12. The receiver module 12 then generates the IQ data associated with the signal based on the signal. Hence, IQ data may be received and/or generated by the receiver module 12. The IQ data associated with the signal is forwarded to the transformation module 14.

The IQ data is transformed into a transform domain by the transformation module 14, thereby generating transformed IQ-data (step S2). The transform domain may depend on the type of signal processed. Thus, the transform domain used for IQ data compression may be selected from a set of different transform domains depending on the type of signal.

The respective transform domain may be a time domain, a frequency domain, and/or a time-frequency domain (also called spectrogram or rather spectrogram waterfall) so that the respective IQ data is transformed in a suitable transform domain depending on the type of signal processed as mentioned above.

Thus, the respective signal, or more precisely the IQ data associated with the signal, may be transformed into the frequency domain, for instance by applying a Fourier transform, or into a time-frequency domain for compressing the respective IQ measurement data appropriately.

Without restriction of generality, the example of the transform domain being a time-frequency domain is described in the following. Accordingly, the transformed IQ data corresponds to a spectrum of the IQ data at several different times.

Thus, the transformed IQ data comprises information on an evolution of the spectrum of the IQ data over time.

Figure 3:
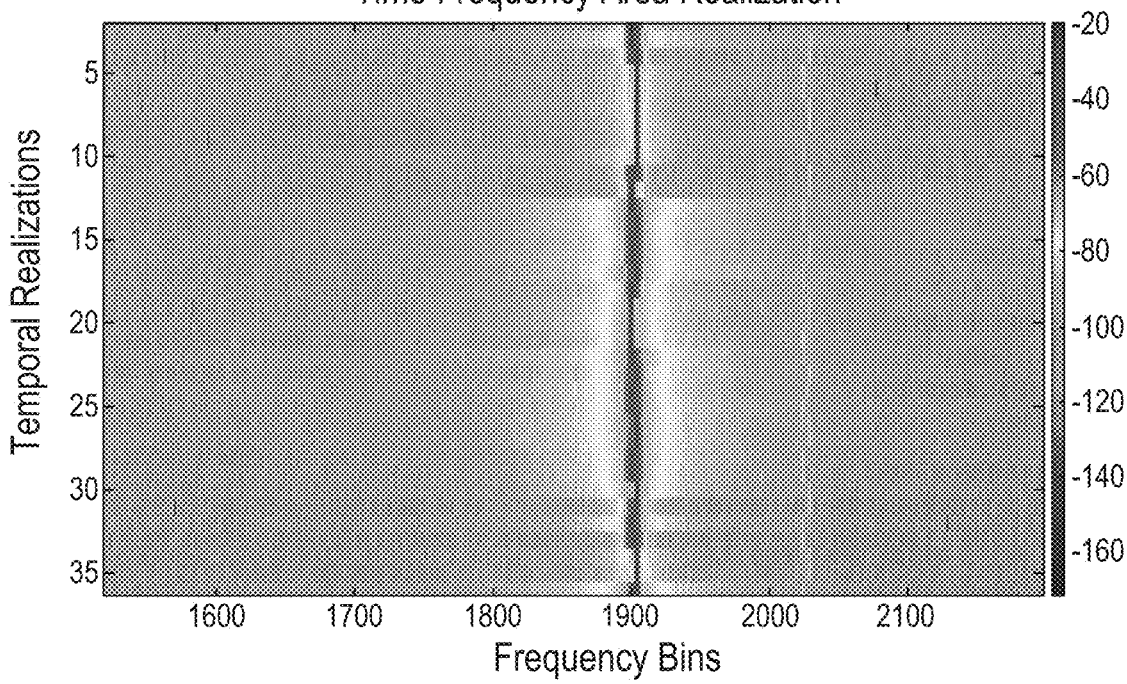
FIG. 3 shows a heat map representation of a spectrogram of a signal.

The result of step S2 is shown in FIG. 3 for a representative electromagnetic signal, where the spectrogram is visualized as a heat map, which is also called "waterfall diagram".

In the example of FIG. 3, the spectrogram is shown for frequency bins ranging from 1500 to 2200. Each frequency bin represents a certain frequency range. More precisely, each frequency bin is associated with a certain frequency range having a certain bandwidth in the complex baseband. For example, each frequency bin may have a bandwidth of 30 to 50 Hz, for example of 35 to 45 Hz.

In FIG. 3, the time is plotted on the vertical axis, the frequency is plotted on the horizontal axis and the respective amplitude of the electromagnetic signal is visualized by the color of the respective points in the frequency-time diagram.

In some embodiments, the amplitude is plotted on a logarithmic scale. In the example shown in FIG. 3, the scale is 20·log$_{10}$(Amplitude) [dB]. In other words, the spectrogram shows a logarithmic power trend of the electromagnetic signal over time, for example over N temporal realizations, and over a predetermined frequency range.

The transformed IQ data is forwarded to the artificial intelligence module 16, or more precisely to the analysis module 24.

In general, the artificial intelligence module determines at least one characteristic parameter based on the transformed IQ data (step S3) and detects and/or classifies at least one wanted signal portion based on the at least one characteristic parameter (step S4).

Therein, the term "classify the wanted signal portion" is generally understood to mean that (certain) information about the signal is determined that is associated with a certain class of electromagnetic signals. For example, a modulation type of the wanted signal portion and/or a symbol rate of the wanted signal portion are determined.

Moreover, the term "detect the wanted signal portion" is understood to mean that portions of the transformed IQ data corresponding to the at least one wanted signal portion are identified There are several different possible ways of performing steps S3 and S4, wherein two representative embodiments will be described in more detail below.

According to a first embodiment, the analysis module 24 generates an image representation of the transformed IQ data. For example, the analysis module 24 generates a heat map (also called waterfall diagram) of the spectrogram as shown in FIG. 3.

The image representation is then used as an input for the machine learning module 26. The machine learning module 26 automatically detects the at least one wanted signal portion based on the image representation of the spectrogram via an image analysis technique that is applied to the image representation. In other words, the machine learning module 26 is trained to automatically detect and/or classify the at least one wanted signal portion based on the image representation of the transformed IQ data.

Figure 4:
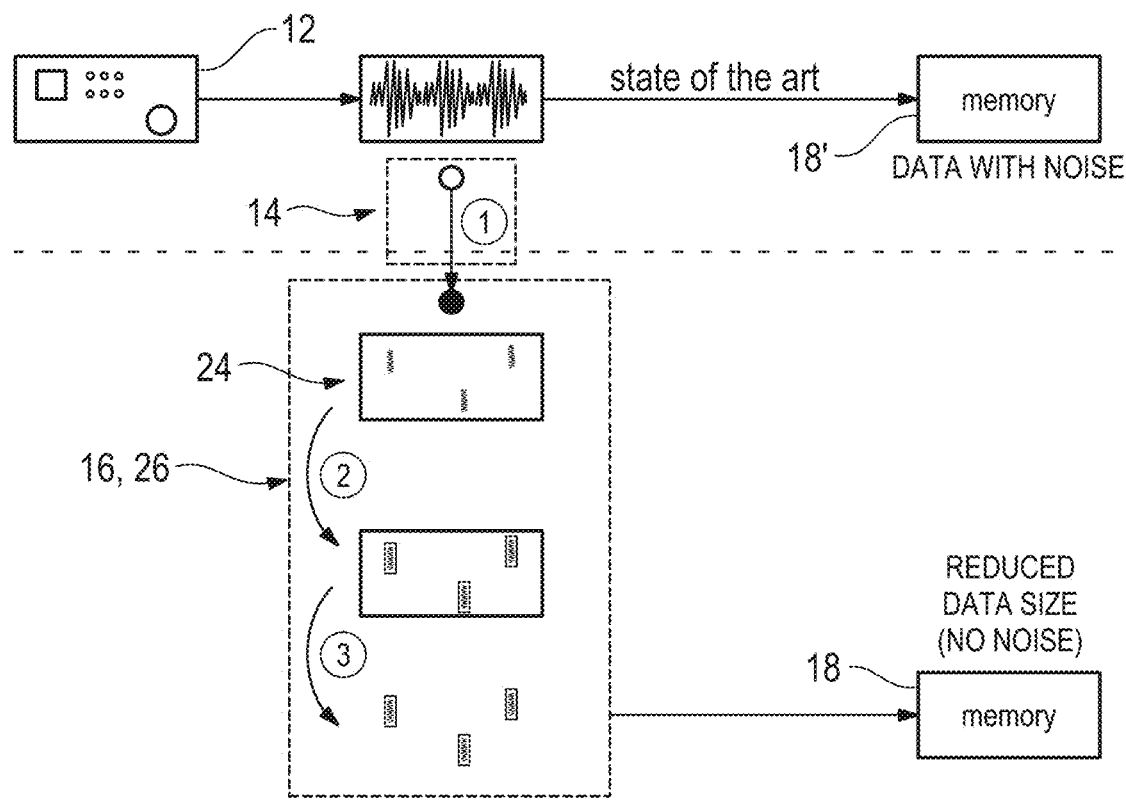
FIG. 4 shows an illustration of individual steps of the method according to an embodiment of the present disclosure.

FIG. 4 shows a comparison of the method described above with a usual IQ recording method known from the state of the art, namely an IQ recording method without IQ data compression. As is shown in FIG. 4, the complete IQ data is forwarded to a memory 18' in the state of the art, resulting in a high memory demand.

In contrast, the methods for compressing IQ data described above reduces the data size of the IQ data with some additional steps.

As indicated by the arrow with the numeral "1", the IQ data is transformed into the transform domain by the transformation module 14. Afterwards, the transformed IQ data is processed via the artificial intelligence module 16, or more precisely via the analysis module 24 and via the machine learning module 26.

As is indicated by the arrow with numeral "2", the machine learning module 26 identifies relevant portions of the transformed IQ data that correspond to the at least one wanted signal portion. The machine learning module 26 may also mark the relevant portions of the transformed IQ data.

As is indicated by the arrow with numeral "3", the machine learning module 26 may then extract a subset of the transformed IQ data that is associated with the at least one wanted signal portion. The subset of the transformed IQ data may then be forwarded to the memory 18. Alternatively or additionally, the subset of the transformed IQ data may be transformed back into the original domain, for example into the time domain.

According to a second embodiment, the analysis module 24 determines at least one correlation parameter or rather a correlation multi-dimensional algebraic objects that comprises several correlation parameters based on the determined spectrogram. Some specific examples for the correlation multi-dimensional algebraic object will be given in the following. However, it is to be understood that every other suitable type of correlation parameter could be used as well.

One example for the correlation multi-dimensional algebraic object is a frequency-to-frequency correlation matrix $\rho_{ij} = \rho(A(f_i), A(f_j))$ that is calculated for several, for example all frequency pairs $f_i$, $f_j$ in the predetermined frequency range. Therein, $A(f_i)$ is the amplitude of the electromagnetic signal at frequency $f_i$.

Thus, a correlation multi-dimensional algebraic object of order two is determined, namely the frequency-to-frequency correlation matrix $\rho_{ij}$.

The frequency-to-frequency correlation matrix is calculated according to the following formula:

$$\rho_{ij} = \frac{1}{(N-1)} \sum_{k=1}^{N} \frac{(A_k(f_i) - \mu_{A(f_i)})(A_k(f_j) - \mu_{A(f_j)})}{\sigma_{A(f_i)} \sigma_{A(f_j)}}.$$

Like above, N is the number of temporal realizations. Further, $\mu_{A(f_i)}$ is the expectation value of the amplitude of the electromagnetic signal at frequency $f_i$ and $\sigma_{A(f_i)}$ is the variance of the amplitude of the electromagnetic signal at frequency $f_i$.

In other words, a frequency-to-frequency correlation coefficient, more precisely the Pearson correlation coefficient $\rho$ is determined for several, for example for all frequency pairs $f_i$, $f_j$.

Figure 5:
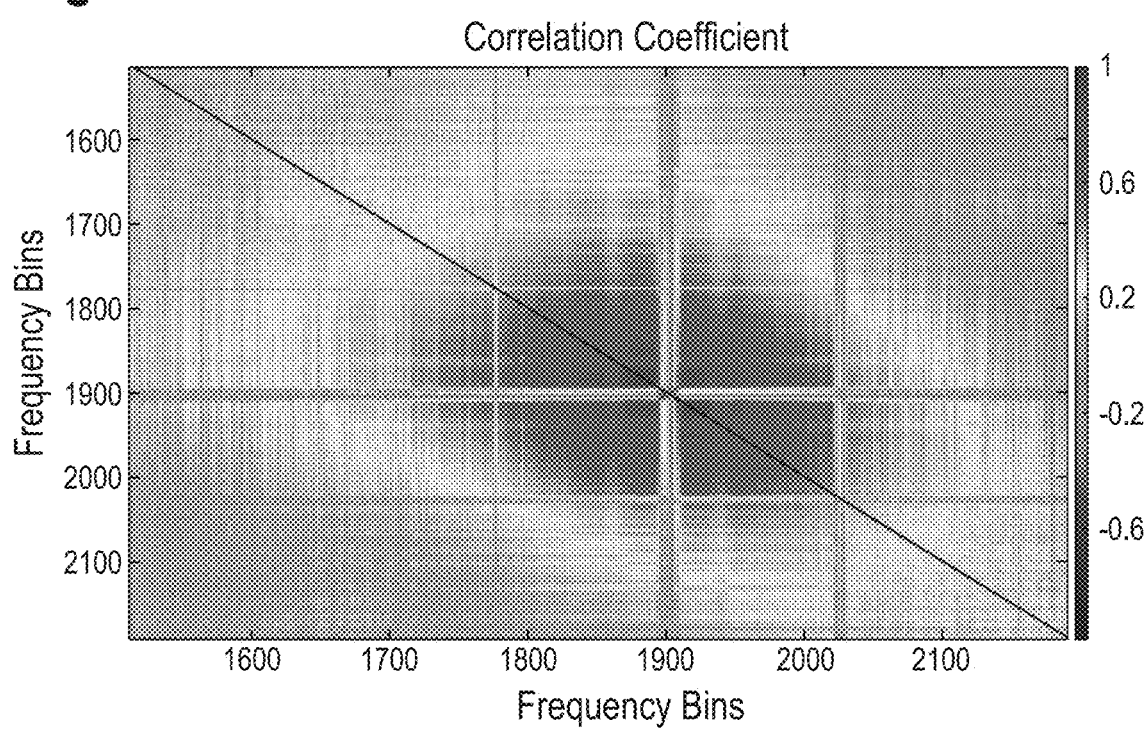
FIG. 5 shows a plot of a frequency-to-frequency correlation parameter of the spectrogram of FIG. 3.

The result is shown in FIG. 5, which shows a plot or rather a heat map of the determined frequency-to-frequency correlation matrix. Therein, the frequencies $f_i$ and $f_j$ are plotted on the horizontal and on the vertical axis, respectively. The respective value $\rho_{ij}$ of the correlation coefficient is depicted by the color of the respective point in the diagram.

Generally speaking, the determined correlation multi-dimensional algebraic object is then used as an input for the machine learning module 26. In some embodiments, the determined correlation parameters, i.e., the entries of the determined frequency-to-frequency correlation matrix $\rho_{ij}$ are then used as an input for the machine learning module 26.

Finally, the machine learning module 26, for example the artificial neural network, detects and/or classifies the wanted signal in the electromagnetic signal at least partially based on the determined correlation multi-dimensional algebraic object. In the example described above, the artificial neural network detects and/or classifies the at least one wanted signal portion based on the determined correlation parameters, i.e., based on the determined frequency-to-frequency correlation matrix $\rho_{ij}$.

Alternatively or additionally, an image may be generated based on the determined correlation parameters, for example a heat map of the correlation coefficients. An example for such a heat map is depicted in FIG. 5, as already discussed above.

The machine learning module 26 or rather the artificial neural network then applies image processing and/or image recognition techniques to the generated image in order to detect and/or classify the at least one wanted signal portion comprised in the electromagnetic signal.

It has turned out that several different classes of wanted signal portions exhibit similar correlation patterns, i.e., the image generated based on the determined correlation coefficients are similar to each other. Accordingly, the number of different correlation patterns that the artificial neural network has to be trained for is reduced. Thus, smaller artificial neural networks can be used, which results in an enhanced processing speed for the detection and/or classification according to this embodiment of the method.

Thus, methods of the present disclosure are particularly suitable for detecting the at least one wanted signal portion or for classifying the wanted signal if a rough classification is sufficient.

Moreover, the correlation parameters and thus also the respective generated image comprise information on signal collisions, i.e., about a superposition of two or more signals in the same frequency band. An example of a spectrogram of an electromagnetic signal comprising a signal collision is shown in FIG. 6.

Figure 7:
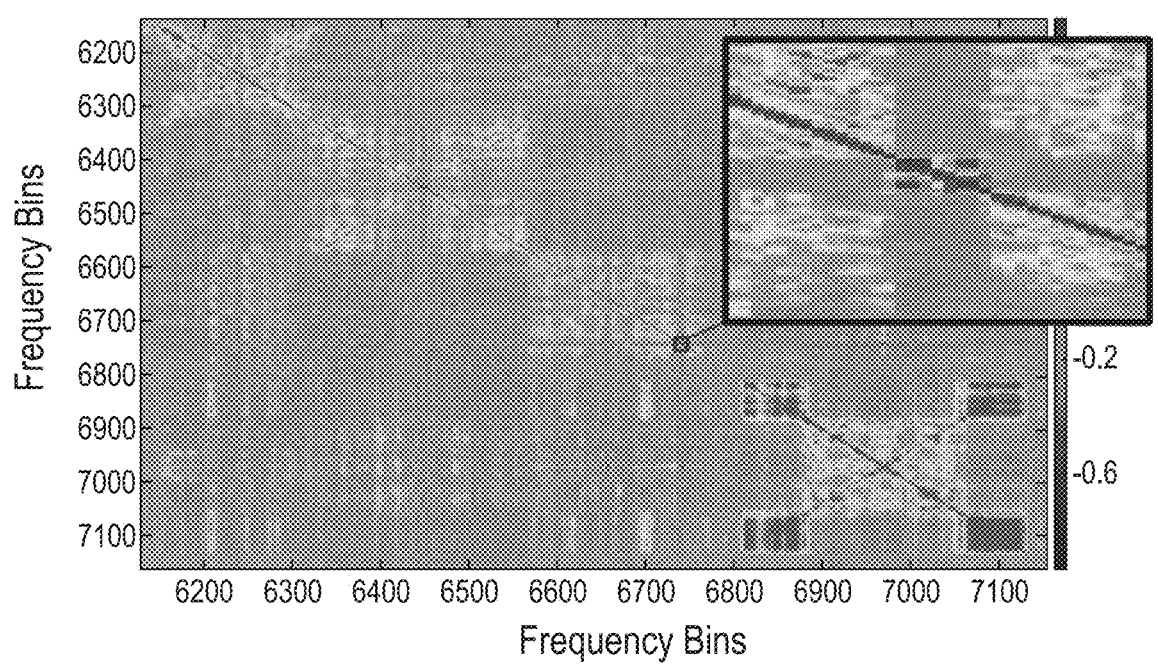
FIG. 7 shows a plot of a frequency-to-frequency correlation parameter of the spectrogram of FIG. 6.

Such signal collisions usually are not visible in the spectrogram. However, it turned out that such signal collisions can be identified based on the corresponding correlation parameters of the spectrogram as shown in FIG. 7. An example for a typical structure corresponding to colliding signals is depicted in the magnified area in FIG. 7.

Figure 6:
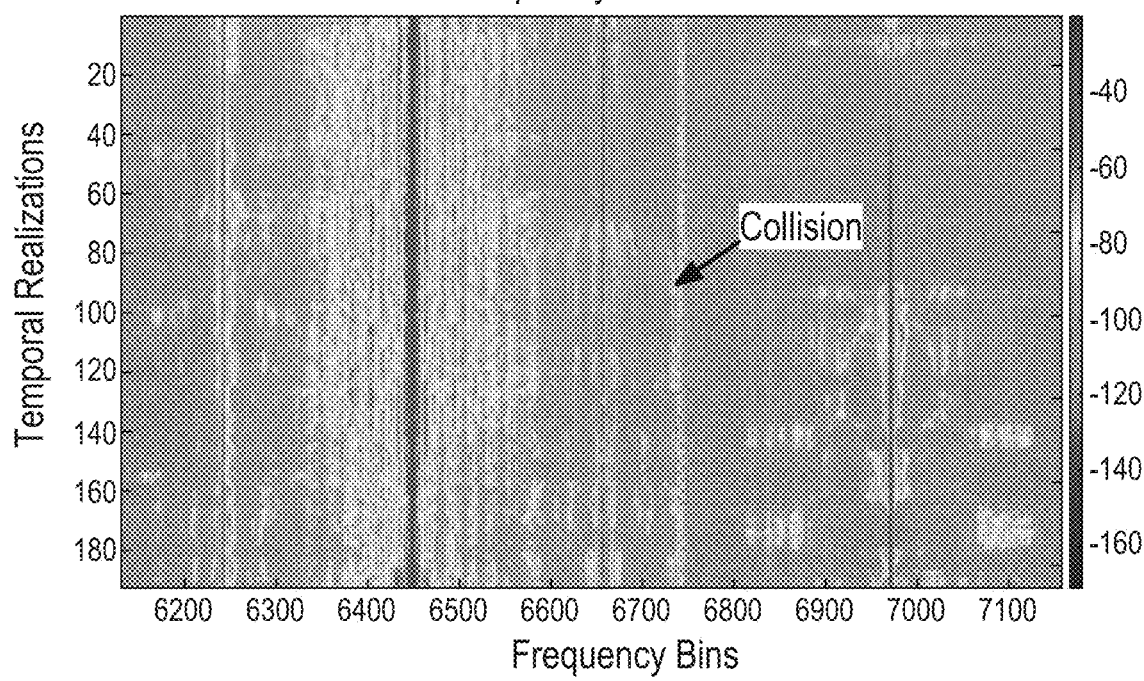
FIG. 6 shows a second spectrogram of a second electromagnetic signal.

Additionally or alternatively, an image may be generated based on the determined spectrogram, for example a heat map of the spectrogram like exemplarily shown in FIGS. 3 and 6.

The machine learning module 26 or the artificial neural network then applies image processing and/or image recognition techniques to the generated image in order to detect and/or classify the at least one wanted signal portion comprised in the electromagnetic signal. Additionally, the determined correlation multi-dimensional algebraic object is used as additional metadata for the machine learning module 26, for example for the artificial neural network.

Thus, in this embodiment, the image processing and/or recognition techniques are applied directly to the spectrogram instead of to the image generated based on the correlation parameters. The determined correlation parameters serve as additional information.

As already explained above, the correlation parameters inter alia comprise information on signal collisions, which might not be resolvable in the spectrogram alone. However, by combining the image analysis of the spectrogram with the additional information comprised in the correlation parameters, the information on signal collisions comprised in the electromagnetic signal is recovered.

In principal, the correlation parameters described above can be used as metadata. It turned out that correlation multi-dimensional algebraic objects of third order are particularly suitable for use as metadata.

Figure 8:
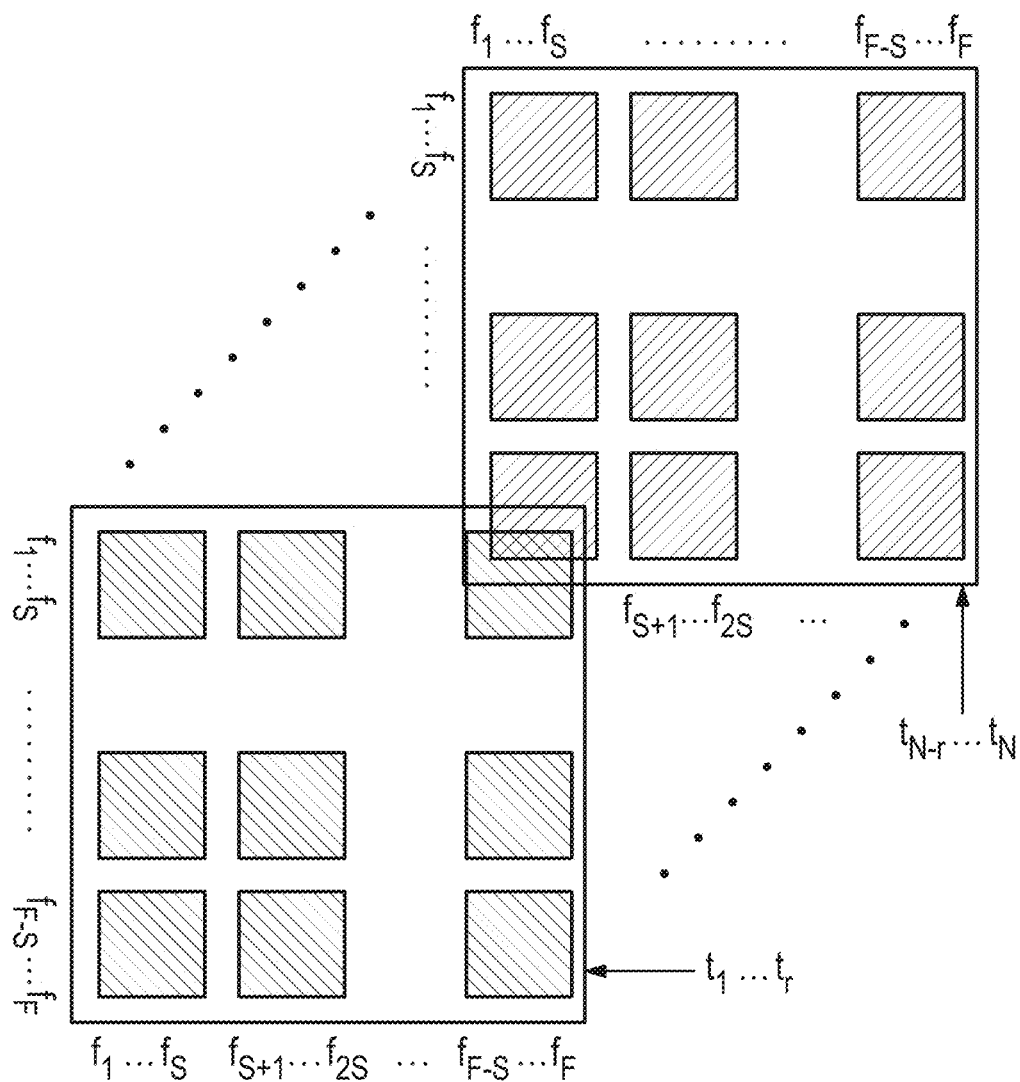
FIG. 8 shows an illustration of a correlation multi-dimensional algebraic object.

An example for such a correlation multi-dimensional algebraic objects of third order is illustrated in FIG. 8. In some embodiments, the correlation multi-dimensional algebraic objects of third order may be a tensor of third order.

Instead of averaging over all N time realizations as in the definition of $\rho_{ij}$ given above, the sum or rather the time average is only performed over r time realizations for each entry of the correlation multi-dimensional algebraic object of third order, wherein r is a natural number. In other words, the N time realizations are divided into several time slices that each contain r time realizations.

Moreover, the predetermined frequency range is divided into several frequency portions that each contain s frequency bins of a total number of F frequency bins, wherein s and F are natural numbers. In other words, each entry of the correlation multi-dimensional algebraic object of third order is associated with s frequency bins. For example, for each entry a sum or an average over the respective s frequency bins is taken.

The resulting correlation multi-dimensional algebraic object of third order $\rho_{ij,k}$ has three indices, namely indices i and j each indicating the respective frequency portion, and an index k indicating the respective time slice.

For example, the entry "$\rho_{12,3}$" of the correlation multi-dimensional algebraic object of third order is associated with the frequency portions $(f_1 \ldots f_s)$ and $(f_{s+1} \ldots f_{2s})$ as well as with the time slice $(t_{2r-1} \ldots t_{3r})$.

The determined correlation multi-dimensional algebraic object of third order may then be used as an input for the machine learning module 26, for example as metadata for the machine learning module 26. Alternatively, the determined correlation multi-dimensional algebraic object of third order may be unfolded with respect to one of the indices i, j and k. In the unfolding, one dimension of the correlation multi-dimensional algebraic object of third order is kept constant while the other two dimensions are stacked. More specifically, the indices i and j each run from 1 to F/s, while the index k runs from 1 to N/r.

Accordingly, if the multi-dimensional algebraic object of third order is unfolded with respect to index i, the result is a the multi-dimensional algebraic object of second order, i.e., a matrix, with F/s entries for the first index and with F/s·N/r entries for the second index.

Similarly, if the multi-dimensional algebraic object of third order is unfolded with respect to index j, the result is a the multi-dimensional algebraic object of second order, i.e., a matrix, with F/s·N/r entries for the first index and with F/s entries for the second index.

Finally, if the multi-dimensional algebraic object of third order is unfolded with respect to index k, the result is a the multi-dimensional algebraic object of second order, i.e., a matrix, with $F^2/s^2$ entries for the first index and with N/r entries for the second index.

The unfolded multi-dimensional algebraic object may then be used as an input for the machine learning module 26, for example as metadata for the machine learning module 26.

Alternatively, higher order singular values of the correlation multi-dimensional algebraic object are determined based on at least one, for example based on all of the unfolded correlation multi-dimensional algebraic objects described above. For this purpose, a singular value decomposition may be determined for each of the unfolded correlation multi-dimensional algebraic objects and the correlation multi-dimensional algebraic objects of third order may be multiplied with the respective singular vector of every unfolded correlation multi-dimensional algebraic object.

Then, the higher order singular values may be used as metadata for the machine learning module 26, for example for the artificial neural network.

The machine learning module 26 may detect and/or classify the at least one wanted signal portion based on any one of the techniques described above. The explanations given in the following hold for all of these embodiments.

Therein, the at least one wanted signal portion may be identified automatically based on preset parameters. Generally, the preset parameters are associated with certain properties of the at least one wanted signal portion. For example, the preset parameters are associated with a modulation type of the at least one wanted signal portions, with a frequency content of the at least one wanted signal portions, with amplitudes of the at least one wanted signal portions, with a signal-to-noise-ratio of the at least one wanted signal portions etc.

Thus, the artificial intelligence module 16 may detect and/or classify the at least one wanted signal portion based on the preset parameters. In some embodiments, a user may set the preset parameters in order to narrow down the wanted signal to specific types of signals.

Moreover, the machine learning module 26 may determine additional meta-information on the at least one wanted signal portion. Generally speaking, the meta-information corresponds to additional information on the at least one wanted portion of the signal that may be necessary in order to reconstruct the at least one wanted portion. The meta-information may comprise a noise level associated with the transformed IQ data and/or at least one time stamp.

Only a subset of the IQ data that is associated with the at least one wanted signal portion is stored in the memory 18 (step S5). More precisely, the IQ data that is associated with the at least one wanted signal portion is stored in the memory 18 together with the meta-information mentioned above.

The IQ data corresponding to the remaining signal portions may be discarded, such that the overall memory needed for storing the IQ data is reduced. For example, IQ data corresponding to signal disturbances, for example noise, may be discarded. Moreover, redundant IQ data comprising no additional information may be discarded.

This way, the amount of memory needed is reduced, as the IQ data is compressed to the relevant subset of IQ data. However, no information is lost during the compression of the IQ data, as only the IQ data corresponding to irrelevant portions of the signal is discarded.

The at least one wanted signal portion and/or the signal may then be reconstructed based on the stored IQ data by the signal generator module or rather by the signal generator unit 22 (step S6). In other words, the signal generator unit 22 may generate an output signal having the properties of the at least one original wanted signal portion.

As all relevant information on the signal (contained in the stored subset of the IQ data) are stored in the memory 18, the at least one wanted signal portion and/or the complete signal can be reconstructed based on the stored IQ data.

In some embodiments, if the meta-information comprises information on the noise level of the original signal, even the noise-content of the original signal may be reproduced based on the IQ data and the meta-information stored in the memory 18.

As briefly described above, certain embodiments disclosed herein, for example the respective module(s), unit(s), etc., utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method of compressing digital signal data obtained from a signal, comprising:

receiving digital signal data associated with a signal and/or generating digital signal data based on a signal;

transforming the digital signal data into a transform domain, thereby generating transformed digital signal data, wherein a spectrogram of the digital signal is determined based on the transformed digital signal data;

determining at least one characteristic parameter based on the transformed digital signal data by an artificial intelligence circuit;

detecting and/or classifying at least one wanted signal portion based on the at least one characteristic parameter by the artificial intelligence circuit; and storing only a subset of the digital signal data that is associated with the at least one wanted signal portion.

2. The method of claim 1, wherein the at last one characteristic parameter is associated with a modulation type of the signal.

3. The method according to claim 1, wherein the subset of the digital signal data is stored together with meta-information on the signal.

4. The method according to claim 3, wherein the meta-information comprises a noise level associated with at least one discarded subset of the digital signal data and/or a time stamp.

5. The method according to claim 1, wherein the at least one characteristic parameter comprises at least one correlation parameter.

6. The method according to claim 1, wherein the at least one characteristic parameter comprises a correlation multi-dimensional algebraic object comprising several correlation parameters.

7. The method according to claim 6, wherein the correlation multi-dimensional algebraic object is at least of third order.

8. The method of claim 7, wherein entries of the correlation multi-dimensional algebraic object are determined that correspond to frequency-to-frequency correlation coefficients.

9. The method of claim 1, wherein the at least one characteristic parameter is determined based on the spectrogram and/or based on characteristic patterns in the spectrogram.

10. The method according to claim 1, wherein the at least one characteristic parameter is determined via an image analysis technique that is applied to an image associated with the transformed digital signal data and/or to the spectrogram of the digital signal data.

11. The method according to claim 1, wherein the artificial intelligence circuit comprises a machine learning circuit, wherein the machine learning circuit is trained to determine the at least one characteristic parameter, and/or wherein the machine learning circuit is trained to detect and/or classify the at least one wanted signal portion.

12. The method according to claim 11, wherein the machine learning circuit comprises an artificial neural network.

13. The method of claim 12, wherein the artificial neural network is a convolutional neural network.

14. The method according to claim 1, wherein the wanted signal portion and/or the signal is reconstructed based on the stored digital signal data and/or based on the stored meta-information.

15. The method according to claim 1, wherein the digital signal data is established as IQ data.

16. A non-transitory computer readable media having computer program code stored thereon, the computer program code being adapted to cause a signal compressor circuit to perform the method according to claim 1 when the computer program code is executed on a computer processor circuit.

17. A signal compressor circuit for compressing digital signal data obtained from a signal, the signal compressor circuit comprising a receiver circuit, a transformation circuit, an artificial intelligence circuit and a memory, wherein the receiver circuit is configured to receive digital signal data associated with a signal and/or to generate digital signal data based on a signal, wherein the transformation circuit is configured to transform the digital signal data into a transform domain, thereby generating transformed digital signal data, wherein the artificial intelligence circuit is configured to determine at least one characteristic parameter based on the transformed digital signal data, wherein the artificial intelligence circuit is further configured to detect and/or classify at least one wanted signal portion based on the at least one characteristic parameter, and wherein the memory is configured to store only a subset of the digital signal data that is associated with the at least one wanted signal portion.

18. The signal compressor circuit of claim 17, wherein the artificial intelligence circuit comprises a machine learning circuit, wherein the machine learning circuit is trained to determine the at least one characteristic parameter, and/or wherein the machine learning circuit is trained to detect and/or classify the at least one wanted signal portion.

19. The signal compressor circuit of claim 18, wherein the machine learning circuit comprises an artificial neural network.

* * * * *